US009640482B1

(12) United States Patent
Chen et al.

(10) Patent No.: US 9,640,482 B1
(45) Date of Patent: May 2, 2017

(54) SEMICONDUCTOR DEVICE WITH A CONTACT PLUG AND METHOD OF FABRICATING THE SAME

(71) Applicant: UNITED MICROELECTRONICS CORP., Hsin-Chu (TW)

(72) Inventors: Pin-Hong Chen, Yunlin County (TW); Kuo-Chih Lai, Tainan (TW); Min-Chuan Tsai, New Taipei (TW); Chun-Chieh Chiu, Keelung (TW); Li-Han Chen, Tainan (TW); Yen-Tsai Yi, Tainan (TW); Wei-Chuan Tsai, Changhua County (TW); Kuo-Chin Hung, Changhua County (TW); Hsin-Fu Huang, Tainan (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/097,301

(22) Filed: Apr. 13, 2016

(51) Int. Cl.
*H01L 23/532* (2006.01)
*H01L 23/528* (2006.01)
*H01L 21/768* (2006.01)
*H01L 29/45* (2006.01)
*H01L 23/522* (2006.01)

(52) U.S. Cl.
CPC .... *H01L 23/5283* (2013.01); *H01L 21/76843* (2013.01); *H01L 21/76889* (2013.01); *H01L 21/76897* (2013.01); *H01L 23/53266* (2013.01); *H01L 29/45* (2013.01); *H01L 23/5226* (2013.01)

(58) Field of Classification Search
CPC ............. H01L 23/5226; H01L 23/53266
USPC .......... 257/751, 754; 438/653, 655, 675
See application file for complete search history.

(56) References Cited

U.S. PATENT DOCUMENTS

| 8,236,691 | B2* | 8/2012 | Shor | H01L 21/28512 257/E21.507 |
|---|---|---|---|---|
| 8,778,797 | B2* | 7/2014 | Gao | H01L 21/28556 438/656 |
| 2007/0222066 | A1* | 9/2007 | Cabral, Jr. | H01L 21/2885 257/734 |
| 2008/0079165 | A1* | 4/2008 | Fischer | H01L 21/76843 257/762 |
| 2008/0254617 | A1* | 10/2008 | Adetutu | H01L 21/76843 438/643 |
| 2009/0209101 | A1* | 8/2009 | Shinriki | C23C 16/32 438/686 |

\* cited by examiner

*Primary Examiner* — George Fourson, III
(74) *Attorney, Agent, or Firm* — Winston Hsu; Scott Margo

(57) ABSTRACT

The present invention utilizes a barrier layer in the contact hole to react with an S/D region to form a silicide layer. After forming the silicide layer, a directional deposition process is performed to form a first metal layer primarily on the barrier layer at the bottom of the contact hole, so that very little or even no first metal layer is disposed on the barrier layer at the sidewall of the contact hole. Then, the second metal layer is deposited from bottom to top in the contact hole as the deposition rate of the second metal layer on the barrier layer is slower than the deposition rate of the second metal layer on the first metal layer.

20 Claims, 3 Drawing Sheets

SEMICONDUCTOR DEVICE WITH A CONTACT PLUG AND METHOD OF FABRICATING THE SAME

BACKGROUND OF THE INVENTION

1. Field of the Invention

The present invention relates to a semiconductor device with a contact plug and a method of fabricating the same, and more particularly to a semiconductor device with a contact plug which is deposited from the bottom to the top of the contact hole.

2. Description of the Prior Art

As semiconductor devices such as ICs and LSIs become more miniaturized, the interconnection layer structure being made in a multi-layered form becomes more significant. In multi-level interconnection, there are several techniques for connecting the interconnection layers to each other; for example, contact plugs are used to connect conducting layers on two different levels.

Existing processes for forming the contact plug often result in the formation of contact plugs that have voids. The voids result from the fact that conventional deposition processes do not form the metal layer uniformly inside the contact hole, leaving a void in the lower region.

SUMMARY OF THE INVENTION

Therefore, it is an object of the present invention to provide a novel method to fabricate a contact plug without voids.

According to a first preferred embodiment of the present invention, a semiconductor device with a contact plug includes a substrate, at least one gate structure disposed on the substrate, an S/D region disposed within the substrate and at one side of the gate structure, a dielectric layer covering the substrate and the gate structure, a contact hole defined within the dielectric layer, wherein the S/D region is exposed through the contact hole, a silicide layer disposed on and contacting the S/D region, wherein the silicide layer is only disposed within the contact hole, a barrier layer disposed on a sidewall of the contact hole and a bottom of the contact hole, wherein the barrier layer comprises one metal the same as the silicide layer, and a first metal layer disposed on the barrier layer at the bottom of the contact hole and a second metal layer disposed within the contact hole, wherein a density of the first metal layer is larger than a density of the second metal layer, and the first metal layer and the second metal layer are the same metal.

According to a second preferred embodiment of the present invention, a method of fabricating a semiconductor device with a contact plug includes providing a substrate with at least one gate structure disposed thereon. A dielectric layer covers the substrate and the gate structure, wherein an S/D region is disposed in the substrate at one side of the gate structure. Next, a contact hole is formed within the dielectric layer and exposes the S/D region through the contact hole. Later, a barrier layer is formed to conformally cover the contact hole, the S/D region and the dielectric layer. Subsequently, a salicide process is performed to transform part of the barrier layer and part of the S/D region into a silicide layer formed on the S/D region. After the salicide process, a directional deposition process is performed to form a first metal layer on the barrier layer, wherein a thickness of the first metal layer on the barrier layer at a bottom of the contact hole is at least ten times greater than a thickness of the first metal layer on the barrier layer at a sidewall of the contact hole. Finally, a deposition process is performed to form a second metal layer in the contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a method of fabricating a contact plug according to a preferred embodiment of the present invention, wherein:

FIG. 1 shows a substrate with two gate structures and a dielectric layer thereon;

FIG. 2 shows a fabricating stage of forming a barrier layer;

FIG. 3 shows a fabricating stage of performing a salicide process;

FIG. 4 shows a fabricating stage of performing a directional deposition process;

FIG. 5 shows a fabricating stage of performing a non-directional deposition process; and FIG. 6 shows a fabricating stage of performing a planarization process.

DETAILED DESCRIPTION

FIG. 1 to FIG. 6 depict a method of fabricating a contact plug according to a preferred embodiment of the present invention.

Figure 1:
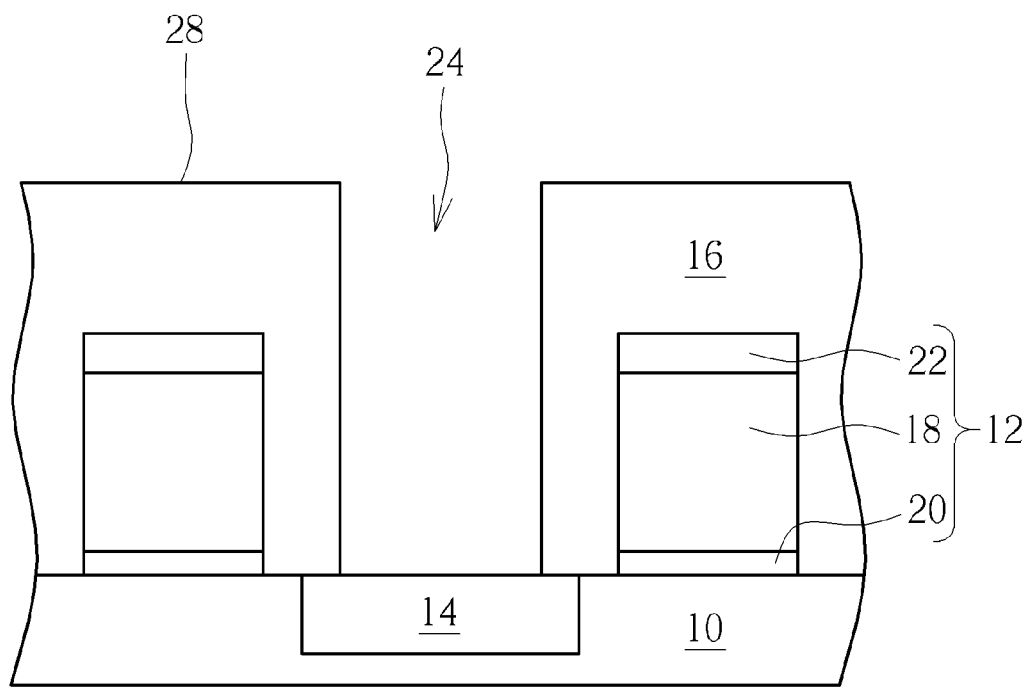

As shown in FIG. 1, a substrate 10 is provided. The substrate 10 can be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. At least one gate structure 12 is disposed on the substrate 10. In this embodiment, there are two gate structures 12 disposed on the substrate 10; however, the number of the gate structures 12 is not limited, and can be adjusted based on different requirements. An S/D region 14 is disposed in the substrate 10. The S/D region 14 is preferably disposed at one side of one of the gate structures 12, but can be disposed between the two gate structures 12. A dielectric layer 16 covers the substrate 10 and the gate structures 12. Each of the gate structures 12 includes a gate electrode 18, a gate dielectric layer 20 and a cap layer 22. The gate electrode 18 may be polysilicon, metal or polysilicide. The gate dielectric layer 20 is typically fabricated from silicon dioxide, silicon nitride, silicon oxynitride and/or a layer or layers of materials having a high dielectric constant such as $Al_2O_3$, $ZrO_2$, barium strontium titanate (BST), lead zirconate titanate (PZT), $ZrSiO_2$, $HfSiO_2$, HfSiON, $TaO_2$, and the like. The S/D region 14 may include an epitaxial layer such as SiP or SiGe. Alternatively, the S/D region 14 may be a region of the substrate 10 with dopants implanted therein.

Although the present invention pertains to a planar MOS transistor, it is also desirable to apply the process of the present invention to non-planar transistors, such as FinFET devices. In such instances, the substrate 10 shown in FIG. 1 would become a fin-shaped structure formed atop a substrate 10.

Figure 2:
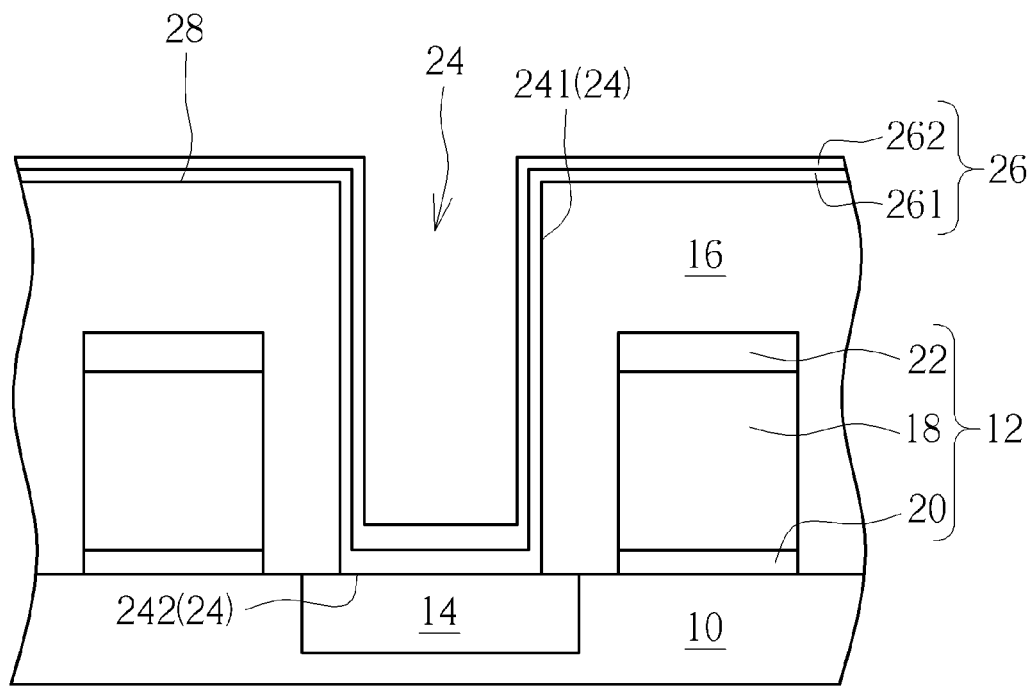

A contact hole 24 is formed within the dielectric layer 16 and the S/D region 14 is exposed through the contact hole 24. As shown in FIG. 2, a barrier layer 26 is formed to conformally cover the contact hole 24, the S/D region 14 and a top surface 28 of the dielectric layer 16. In detail, the barrier layer 26 covers a sidewall 241 and a bottom 242 of the contact hole 24. A thickness of the barrier layer 26 at the bottom 242 of the contact hole 24 is greater than twice a thickness of the barrier layer 26 at the sidewall 241 of the contact hole 24. The barrier layer 26 may be multiple layers. For example, the barrier layer 26 includes a first sub layer 261 and a second sub layer 262, wherein the first sub layer 261 is metal and the second sub layer 262 is metal nitride. According to a preferred embodiment of the present invention, the first sub layer 261 is titanium, and the second sub layer 262 is titanium nitride. In another example, the first sub layer 261 is tantalum, and the second sub layer 262 is tantalum nitride. The first sub layer 261 contacts the sidewall 241 and the bottom 242 of the contact hole 24. The second sub layer 262 contacts the first sub layer 261.

Figure 3:
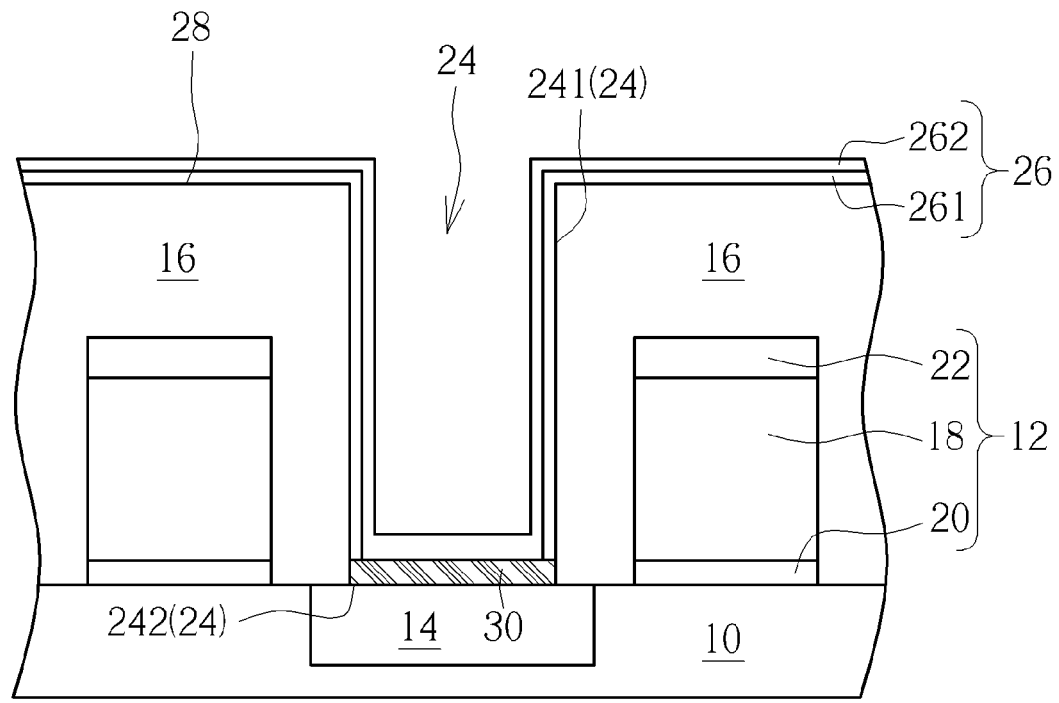

As shown in FIG. 3, a salicide process is performed to transform part of the barrier layer 26 and part of the S/D region 14 into a silicide layer 30 formed on the S/D region 14. In detail, the first sub layer 261 of the barrier layer 26 at the bottom 242 of the contact hole 24 reacts with the S/D region 14 to form the silicide layer 30. Therefore, after the salicide process, the thickness of the barrier layer 26 at the bottom 242 of the contact hole 24 will be less than twice the thickness of the barrier layer 26 at the sidewall 241 of the contact hole 24. According to a preferred embodiment of the present invention, a thickness of the silicide layer 30 is between 40 to 60 angstroms.

Figure 4:
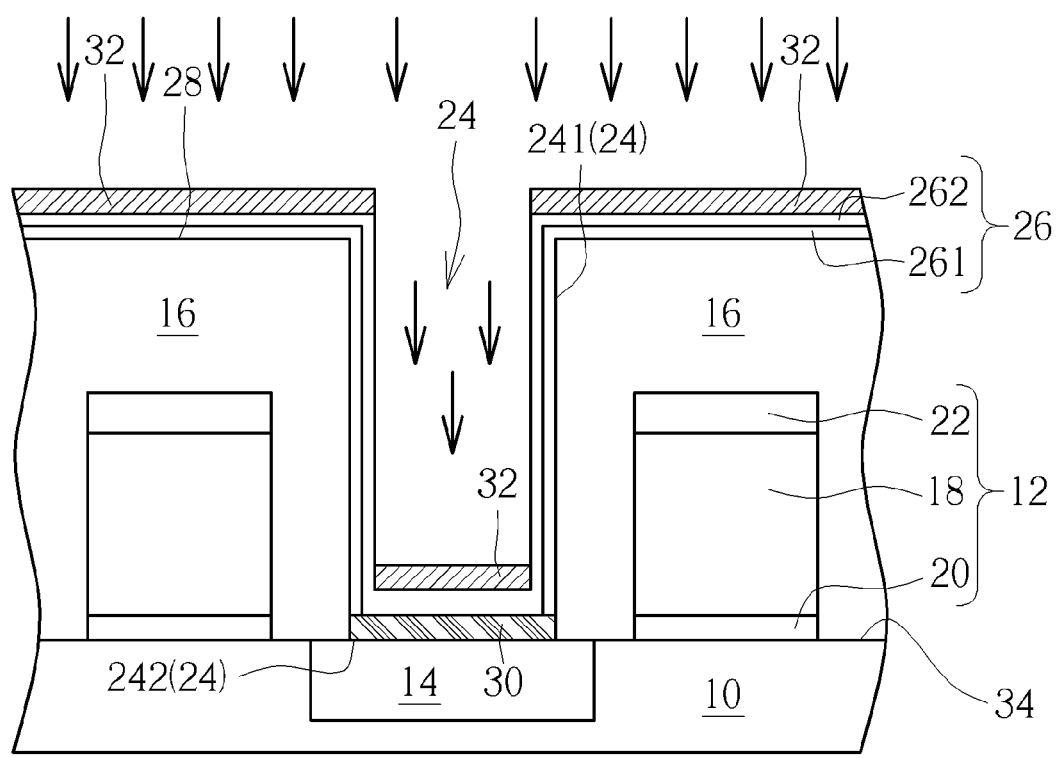

As shown in FIG. 4, after the salicide process, a directional deposition process such as a directional physical vapor deposition process is performed to form a first metal layer 32 on the barrier layer 26 at the bottom 242 of the contact hole 24. Meanwhile, the first metal layer 32 is also formed on the barrier layer 26 covering the top surface 28 of the dielectric layer 16 during the directional deposition process. It is noteworthy that the bottom 242 of the contact hole 24 and the top surface 28 of the dielectric layer 16 are parallel to a top surface 34 of the substrate 10. According to a first preferred embodiment of the present invention, the first metal layer 32 is also formed on the barrier layer 26 at the sidewall 241 of the contact hole 24 during the directional deposition process, wherein a thickness of the first metal layer 32 on the barrier layer 26 at the bottom 242 of the contact hole 24 is at least ten times greater than a thickness of the first metal layer 32 on the barrier layer 26 at the sidewall 241 of the contact hole 24. Moreover, in this first preferred embodiment, the first metal layer 32 on the barrier layer 26 at the sidewall 241 of the contact hole 24 is discontinuous.

According to a second preferred embodiment of the present invention, no first metal layer 32 will be formed on the barrier layer 26 at the sidewall 241 of the contact hole 24 during the directional deposition process.

The first metal layer 32 will serve as a nucleation layer in the following process. During the directional deposition process, the processing time, the operational power or the operational frequency of the directional deposition process can be adjusted according to different requirements. The first metal layer 32 may be tungsten, titanium or other metals. Furthermore, in other embodiments, the directional deposition process may be chemical vapor deposition, atomic layer deposition, metal organic chemical vapor deposition, or plasma enhanced chemical vapor deposition. As long as the deposition is directional to allow the formation of the first metal layer 32 on the bottom 242 of the contact hole 24, there will be no significant deposition of the first metal layer 32 on the sidewall 241 of the contact hole 24.

Figure 5:
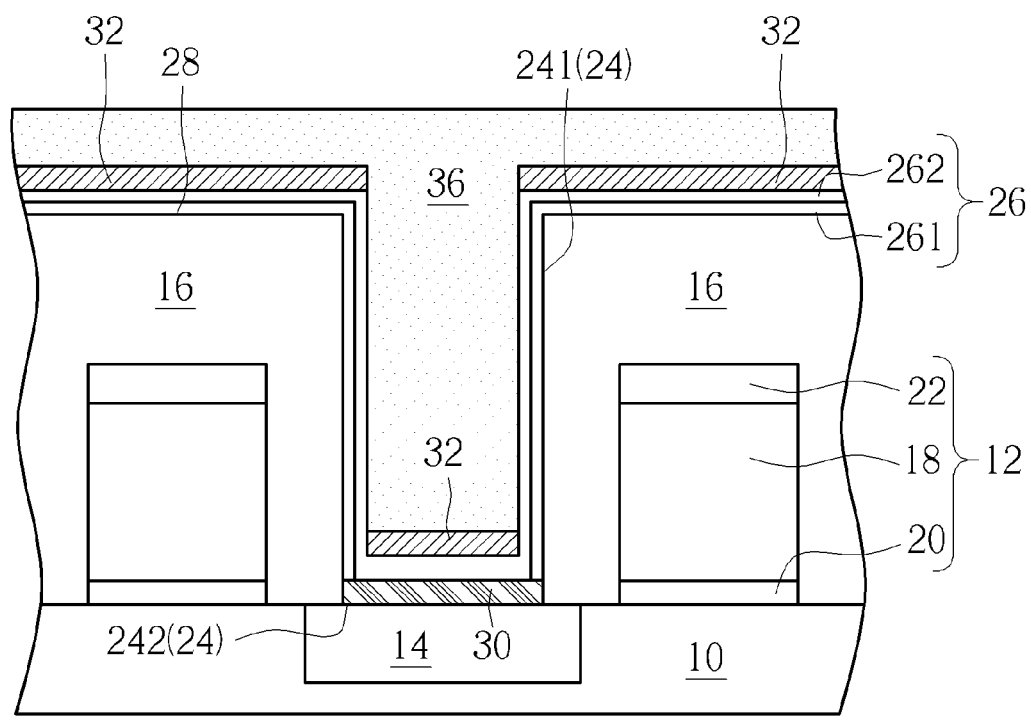

As shown in FIG. 5, a non-directional deposition process such as a chemical vapor deposition process is performed to form a second metal layer 36 in the contact hole 24. Because there is either a discontinuous first metal layer 32 on the sidewall 241 of the contact hole 24 or even no first metal layer 32 on the sidewall 241 of the contact hole 24, at least part of the barrier layer 26 on the sidewall 241 of the contact hole 24 is exposed through the first metal layer 32. The barrier layer 26 on the bottom 242 of the contact hole 24 is entirely covered by the first metal layer 32. As the deposition rate of the second metal layer 36 on the first metal layer 32 is much faster than the deposition rate of the second metal layer 36 on the barrier layer 26, the second metal layer 36 is deposited in a direction from bottom to top of the contact hole 24 rather than inward from the sidewall 241 of the contact hole 24.

The first metal layer 32 and the second metal layer 36 are the same metal. For example, the first metal layer 32 and the second metal layer 36 are both tungsten or titanium, but may be of different densities. In one example, the second metal layer 36 has a lower density than the first metal layer 32. For instance, the density of the second metal layer 36 is between 1.4 to 1.5 g/cm$^3$, whereas the density of the first metal layer 32 is about 1.7 g/cm$^3$.

Figure 6:
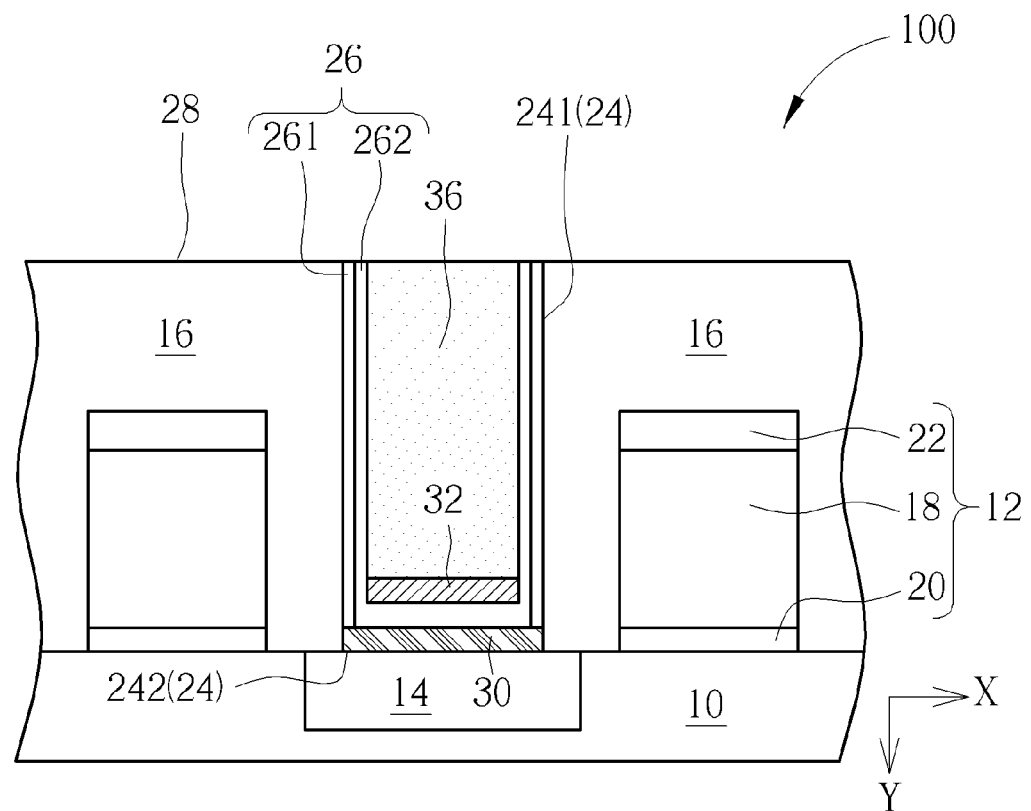

As shown in FIG. 6, a planarization process is performed to remove the second metal layer 36, the first metal layer 32 and the barrier layer 26 above the top surface 28 of the dielectric layer 16. After the planarization process, a top surface of the second metal layer 36 and a top surface 28 of the dielectric layer 16 are aligned. The second metal layer 36, the first metal layer 32 in the contact hole 24 serves as a contact plug. The barrier layer 26 in the contact hole 24 serves as a buffering layer between the second metal layer 36 and the dielectric layer 16.

FIG. 6 depicts a semiconductor device with a contact plug. As shown in FIG. 6, a semiconductor device with a contact plug 100 includes a substrate 10. At least one gate structure 12 is disposed on the substrate 10. In this embodiment, there are two gate structures 12 disposed on the substrate 10; however, the number of gate structures 12 is not limited, and can be adjusted based on different requirements. An S/D region 14 is disposed in the substrate 10. The S/D region 14 can be disposed between the two gate structures 12. A dielectric layer 16 covers the substrate 10 and the gate structures 12. Each of the gate structure 12 includes a gate electrode 18, a gate dielectric layer 20 and a cap layer 22. The gate electrode 18 may be polysilicon, metal or polysilicide. The gate dielectric layer 20 is typically fabricated from silicon dioxide, silicon nitride, silicon oxynitride and/or a layer or layers of materials having a high dielectric constant such as $Al_2O_3$, $ZrO_2$, barium strontium titanate (BST), lead zirconate titanate (PZT), $ZrSiO_2$, $HfSiO_2$, HfSiON, $TaO_2$, and the like. The S/D region 14 may include an epitaxial layer such as SiP or SiGe. Alternatively, the S/D region 14 may be a region of the substrate with dopants implanted therein.

A contact hole 24 is defined within the dielectric layer 16, wherein the S/D region 14 is exposed through the contact hole 24. A silicide layer 30 is disposed on and contacts the S/D region 14. A thickness of the silicide layer 30 is preferably between 40 to 60 angstroms. It is noteworthy that the silicide layer 30 is only disposed within the contact hole 24. In detail, the silicide layer 30 is only disposed within the contact hole 24 in a horizontal direction X, so that silicide layer 30 does not exceed the sidewall 241 of the contact hole 24. In some cases, the silicide layer 30 may exceed the bottom 242 of the contact hole 24 in a vertical direction Y. A barrier layer 26 is disposed on a sidewall 241 of the contact hole 24 and a bottom 242 of the contact hole 24. The barrier layer 26 includes one metal the same as the silicide layer 30. A thickness of the barrier layer 26 at the bottom 242 of the contact hole 24 is less than twice the thickness of the barrier layer 26 at the sidewall 241 of the contact hole 24. For example, the barrier layer 26 at the bottom 242 of the contact hole 24 is less than 50 angstroms. The barrier layer 26 at the sidewall 241 of the contact hole 24 is between 20 to 40 angstroms.

In detail, the barrier layer 26 is preferably formed of multiple layers. For example, the barrier layer may include a first sub layer 261 and a second sub layer 262, wherein the first sub layer 261 is metal and the second sub layer 262 is metal nitride. According to a preferred embodiment of the present invention, the first sub layer 261 is titanium, and the second sub layer 262 is titanium nitride. The silicide layer 30 is titanium silicide. In another example, the first sub layer 241 is tantalum, and the second sub layer 242 is tantalum nitride. The silicide layer 30 is tantalum silicide. The first sub layer 241 contacts the sidewall 241 and the bottom 242 of the contact hole 24. The second sub layer 262 contacts the first sub layer 261.

A first metal layer 32 is disposed on and contacts the barrier layer 26 at the bottom 242 of the contact hole 24. A second metal layer 36 is disposed within the contact hole 24. The second metal layer 36 contacts the barrier layer 26 at the sidewall 241 of the contact hole 24. The first metal layer 32 and the second metal layer 36 are the same metal. For example, the first metal layer 32 and the second metal layer 36 are both tungsten. Alternatively, the first metal layer 32 and the second metal layer 36 may independently be titanium, or other metals. A thickness of the first metal layer 32 on the bottom 242 of the contact hole 24 is preferably about 20 angstroms.

According to a preferred embodiment, the first metal layer 32 is also disposed on the barrier layer 26 at the sidewall 241 of the contact hole 24. It is noteworthy that the first metal layer 32 on the barrier layer 26 at the sidewall 241 of the contact hole 24 is discontinuous. Furthermore, the thickness of the first metal layer 32 on the barrier layer 26 at the bottom 242 of the contact hole 24 is at least ten times greater than a thickness of the first metal layer 32 on the barrier layer 26 at the sidewall 241 of the contact hole 24.

According to another preferred embodiment of the present invention, there is no first metal layer 32 disposed on the barrier layer 26 at the sidewall 241 of the contact hole 24 after the directional deposition process.

The present invention utilizes the barrier layer 26 in the contact hole 24 to react with the S/D region 14 to form a silicide layer 30. After forming the silicide layer 30, a directional deposition process is performed to form a first metal layer 32 primarily on the barrier layer 26 at the bottom 242 of the contact hole 24. Therefore, there is very little or even no first metal layer 32 on the barrier layer 26 at the sidewall 241 of the contact hole 24. Then, the second metal layer 36 is deposited in the contact hole 24. Because the deposition rate of the second metal layer 36 on the barrier layer 26 is slower than the deposition rate of the second metal layer 36 on the first metal layer 32, the second metal layer 36 is deposited in a direction from bottom to top. Since the second metal layer 36 fills in the contact hole 24 from bottom to top, rather than inward from the sidewall 241 of the contact hole 24, there is no hole/void in the second metal layer 36. Therefore, forming the first metal layer by the directional deposition process can prevent voids being formed in the contact plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device with a contact plug, comprising:
   a substrate;
   at least one gate structure disposed on the substrate;
   an S/D region disposed within the substrate and at one side of the gate structure;
   a dielectric layer covering the substrate and the gate structure;
   a contact hole defined within the dielectric layer, wherein the S/D region is exposed through the contact hole;
   a silicide layer disposed on and contacting the S/D region, wherein the silicide layer is only disposed within the contact hole;
   a barrier layer disposed on a sidewall of the contact hole and a bottom of the contact hole, wherein the barrier layer comprises one metal the same as the silicide layer;
   a first metal layer disposed on the barrier layer at the bottom of the contact hole; and
   a second metal layer disposed within the contact hole, wherein a density of the first metal layer is larger than a density of the second metal layer, and the first metal layer and the second metal layer are the same metal.

2. The semiconductor device with a contact plug of claim 1, wherein the barrier layer comprises a first sub layer and a second sub layer, and the first sub layer is metal and the second sub layer is metal nitride.

3. The semiconductor device with a contact plug of claim 2, wherein the first sub layer is titanium and the second sub layer is titanium nitride.

4. The semiconductor device with a contact plug of claim 1, wherein the S/D region comprises an epitaxial layer.

5. The semiconductor device with a contact plug of claim 1, wherein the first metal layer is not on the barrier layer at the sidewall of the contact hole.

6. The semiconductor device with a contact plug of claim 1, wherein the first metal layer contacts the barrier layer at the bottom of the contact hole.

7. The semiconductor device with a contact plug of claim 6, wherein the second metal layer contacts the barrier layer at the sidewall of the contact hole, and the second metal layer contacts the first metal layer.

8. The semiconductor device with a contact plug of claim 1, wherein a thickness of the barrier layer at the bottom of the contact hole is smaller than twice a thickness of the barrier layer at the sidewall of the contact hole.

9. The semiconductor device with a contact plug of claim 1, wherein the first metal layer and the second metal layer are both tungsten.

10. A method of fabricating a semiconductor device with a contact plug, comprising:
    providing a substrate with at least one gate structure disposed thereon, a dielectric layer covering the substrate and the gate structure, wherein an S/D region is disposed in the substrate at one side of the gate structure;
    forming a contact hole within the dielectric layer and exposing the S/D region through the contact hole;
    forming a barrier layer conformally covering the contact hole, the S/D region and the dielectric layer;

performing a salicide process to transform part of the barrier layer and part of the S/D region into a silicide layer formed on the S/D region;

after the salicide process, performing a directional deposition process to form a first metal layer on the barrier layer, wherein a thickness of the first metal layer on the barrier layer at a bottom of the contact hole is at least ten times greater than a thickness of the first metal layer on the barrier layer at a sidewall of the contact hole; and performing a deposition process to form a second metal layer in the contact hole.

11. The method of fabricating a semiconductor device with a contact plug of claim 10, wherein the first metal layer on the barrier layer at the sidewall of the contact hole is discontinuous.

12. The method of fabricating a semiconductor device with a contact plug of claim 10, wherein there is no first metal layer disposed on the barrier layer at the sidewall of the contact hole after the directional deposition process.

13. The method of fabricating a semiconductor device with a contact plug of claim 10, wherein the deposition process is performed after the directional deposition process.

14. The method of fabricating a semiconductor device with a contact plug of claim 10, wherein the silicide layer is only disposed within the contact hole.

15. The method of fabricating a semiconductor device with a contact plug of claim 10, wherein the barrier layer comprises a first sub layer and a second sub layer, and the first sub layer is metal and the second sub layer is metal nitride.

16. The method of fabricating a semiconductor device with a contact plug of claim 15, wherein the first sub layer is titanium and the second sub layer is titanium nitride.

17. The method of fabricating a semiconductor device with a contact plug of claim 10, further comprising:

before forming the contact hole, forming an epitaxial layer on the S/D region.

18. The method of fabricating a semiconductor device with a contact plug of claim 10, wherein during the deposition process, the second metal layer is deposited in a direction from bottom to top of the contact hole rather than inward from a sidewall of the contact hole.

19. The method of fabricating a semiconductor device with a contact plug of claim 10, wherein after the salicide process, a thickness of the barrier layer at the bottom of the contact hole is smaller than twice a thickness of the barrier layer at the sidewall of the contact hole.

20. The method of fabricating a semiconductor device with a contact plug of claim 10, wherein the first metal layer and the second metal layer are both tungsten.

* * * * *